United States Patent
Huang et al.

(10) Patent No.: US 7,899,627 B2
(45) Date of Patent: Mar. 1, 2011

(54) AUTOMATIC DYNAMIC BASELINE CREATION AND ADJUSTMENT

(75) Inventors: Chung-Ho Huang, San Jose, CA (US); Jackie Seto, Mountain View, CA (US); Nicolas Bright, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/536,577

(22) Filed: Sep. 28, 2006

(65) Prior Publication Data

US 2008/0079918 A1 Apr. 3, 2008

(51) Int. Cl.
*G06F 19/00* (2006.01)
*H01L 21/00* (2006.01)
(52) U.S. Cl. ............................................ 702/35; 438/9
(58) Field of Classification Search .................... 702/35, 702/179, 189; 438/5, 9; 250/342, 343
See application file for complete search history.

(56) References Cited

U.S. PATENT DOCUMENTS

| | | | | |
|---|---|---|---|---|
| 5,956,251 A | * | 9/1999 | Atkinson et al. | 700/109 |
| 6,463,391 B1 | * | 10/2002 | Early | 702/85 |
| 6,825,050 B2 | * | 11/2004 | Huang et al. | 438/5 |

OTHER PUBLICATIONS

"Written Opinion", Issue in PCT Application No. PCT/US2007/078574; Mailing Date.: Oct. 30, 2007.
"International Search Report", Issue in PCT Application No. PCT/US2007/078574; Mailing Date.: Oct. 30, 2007.

* cited by examiner

*Primary Examiner*—Bryan Bui
(74) *Attorney, Agent, or Firm*—IPSG, P.C.

(57) ABSTRACT

In a plasma processing system, a method for dynamically establishing a baseline is provided. The method includes processing a first substrate. The method also includes collecting a first signal data for the first substrate. The method further includes comparing the first signal data against the baseline. The method moreover includes including the first signal data in a recalculation of the baseline if the first signal data is within a confidence level range, which is in between a top level above the baseline and a bottom level below the baseline.

20 Claims, 8 Drawing Sheets

AUTOMATIC DYNAMIC BASELINE CREATION AND ADJUSTMENT

BACKGROUND OF THE INVENTION

Advances in plasma and cleaning processing have provided for growth in the semiconductor industry. During plasma processing, hundreds of substrates may be processed. However, not all processed substrates are of acceptable quality standard. To identify the substrates that may not be of acceptable quality standard, fault detection may be implemented. As discussed herein, fault detection refers to the process of identifying potential problematic substrates.

Unacceptable processed substrates may be identified through several different fault detection methods. One method is to manually measure each substrate. However, the process of measuring hundreds of substrates in a production environment may not only be time consuming and costly, but may also be prone to human error.

Alternatively, fault detection may be accomplished by comparing data collected for each substrate against a base line data. As the term is employed herein, baseline data refers to reference measurement that is established to determine the acceptability of a processed substrate. To determine fault detection for each substrate, a plethora of baselines may be established. The number of baselines being established may depend upon the type of data (e.g., voltage bias) being collected and/or monitored.

Figure 1:
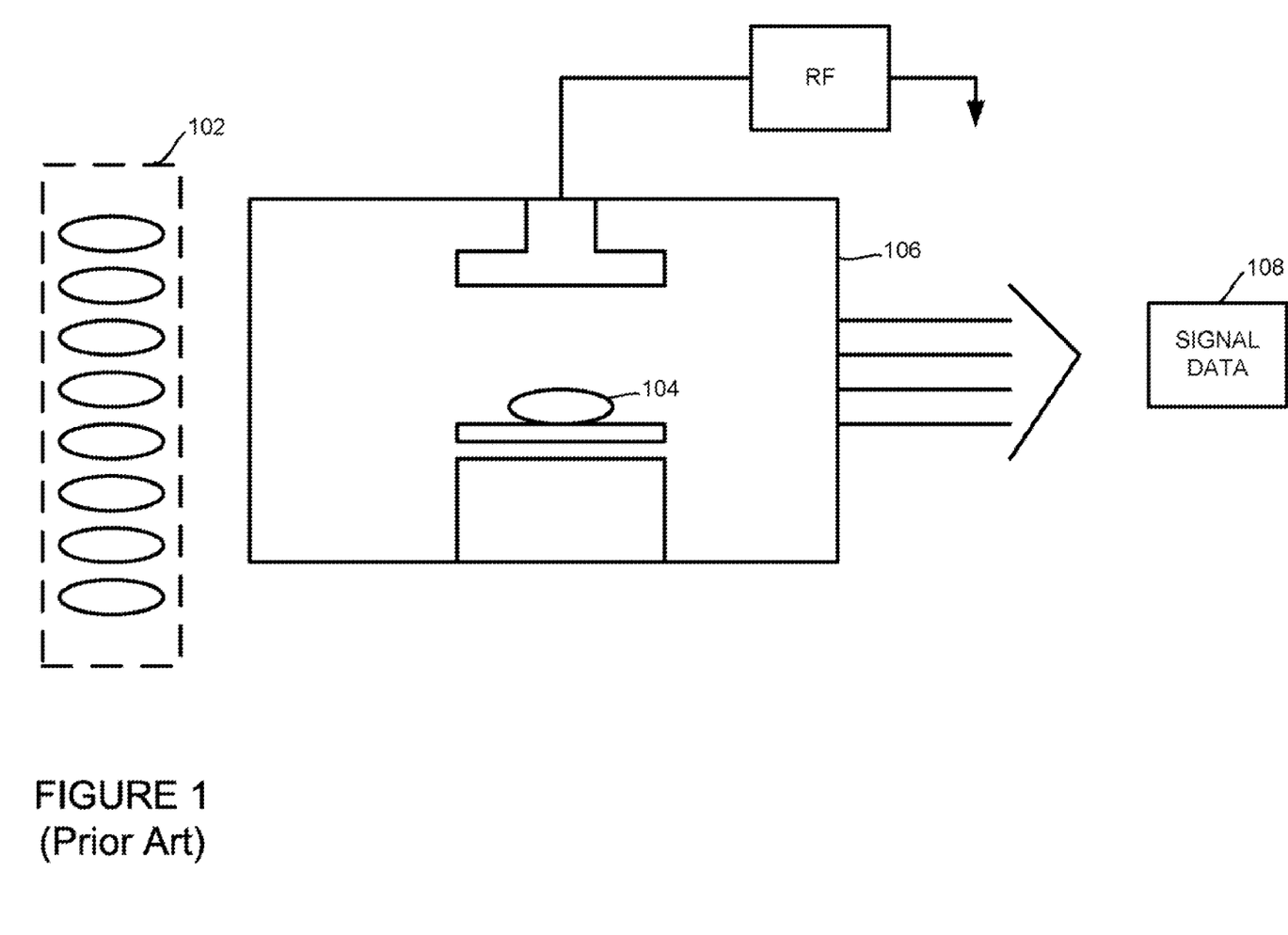
FIG. 1 shows a simple diagram of a plasma processing chamber environment, in which signal data may be gathered.

Generally, an individual (e.g., process engineer) may manually determine the baselines based on his expertise by analyzing the data collected from one or more substrates. To facilitate discussion, FIG. 1 shows a simple diagram of a plasma processing chamber environment, in which signal data may be gathered. Consider the situation wherein, for example, a batch of substrates 102 will be processed. A first substrate 104 is placed into a plasma processing chamber 106. Signal data 108 is collected for substrate 104. Substrate 104 may be measured to determine the suitably of the substrate. Once substrate 104 has been measured, the next substrate in batch of substrates 102 is measured. A large sample of substrates may have to be manually measured in order to create an accurate baseline.

In establishing a baseline, the individual may gather the signal data (e.g., substrate bias voltage measurement) collected for the substrates that are considered acceptable. Then the individual may analyze the signal data to determine the baseline based on his expertise. In an example, if substrate 104 is considered acceptable, the process engineer may include the signal data collected for substrate 104 in establishing baselines for determining the acceptable quality of a substrate in a particular plasma processing chamber, such as plasma processing chamber 106.

In addition, for each baseline, soft and hard tolerance level ranges may be established to determine when a substrate may be considered as unacceptable. As discussed herein, a soft tolerance level and hard tolerance level refer to a percentage difference above and/or below a baseline. The hard tolerance level range also encompasses the soft tolerance range. The substrate may usually be considered acceptable as long as the substrate falls within the hard tolerance level range. Depending upon the client's requirement, the substrates whose signal data fall outside the soft tolerance range may warrant attention and an alarm may be issued.

The process of establishing each baseline, soft tolerance levels, and hard tolerance levels may be a subjective manual process. In other words, the accuracy of the baseline, soft tolerance levels, and hard tolerance levels may be dependent upon the knowledge and skill of the individual(s). In addition, the baseline, soft tolerance levels, and hard tolerance levels may shift over time due to normal operations.

In an example after processing an x number of substrates, certain plasma processing chamber hardware (e.g., o-rings) may have been worn out. In another example, continuous processing may have resulted in deposition accumulating inside the plasma processing chamber. As the conditions of the chamber and hardware change, baselines may shift. The baselines need to account for the changes in the condition of the chamber and hardware to accurately perform fault detection. If not, the acceptability of a substrate may be based on baselines that may no longer be accurate. Thus inaccurate baselines may result in costly errors, such as faulty substrates being retained and/or acceptable substrates being discarded.

SUMMARY OF INVENTION

The invention relates, in an embodiment, in a plasma processing system, to a method for dynamically establishing a baseline. The method includes processing a first substrate. The method also includes collecting a firs signal data for the first substrate. The method further includes comparing the first signal data against the baseline. The method moreover includes including the first signal data in a recalculation of the baseline if the first signal data is within a confidence level range, which is in between a top level above the baseline and a bottom level below the baseline.

In another embodiment, the invention relates to, in a plasma processing system, a method for dynamically establishing a baseline. The method includes processing a first batch of substrates, the first batch of substrates including at least one substrate. The method also includes collecting a first set of signal data for the first batch of substrates. The method further includes comparing each signal data of the first set of signal data against the baseline. The method moreover includes including the each signal data of the first set of signal data in a first statistical calculation if the each signal data is within a confidence level range, which is in between a top level above the baseline and a bottom level below the baseline. The method further yet includes recalculating the baseline based on the first statistical calculation.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiment of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, methods for dynamically establishing baselines are provided. Baselines may be established based on scientific methods that do not rely on specific knowledge or skills of individuals. Embodiments of the invention also enable conditions of a plasma processing chamber and hardware to be incorporated into the creation of baselines. Further, soft and hard tolerance levels may be dynamically established and adjusted using statistical methods.

In this document, various scientific methods and statistical methods may be discussed. This invention, however, is not limited to these scientific and statistical methods. Instead, the discussions are meant as examples and the invention is not limited by the specific scientific and statistical methods presented.

Also in this document various implementations may be discussed using plasma processing system. This invention, however, is no limited to a plasma processing system and may include cleaning system. Instead, the discussions are meant as examples and the invention is not limited by the examples presented.

Consider the situation wherein, for example, a baseline for substrate bias during the main etch step is being generated. In the prior art, the process of establishing a baseline may require human intervention and may be subjected to the knowledge and skill of the individual(s) establishing the baseline. However, embodiments of the invention no longer require or depend upon the individual(s).

A metrology system may be employed to determine if a processed substrate is acceptable. Those skilled in the art are aware that a metrology system may be commonly employed in a production environment to determine the acceptability of a substrate quality or to collect substrate data before, during, or after processing. In some situations, the users may provide further limiting guidelines to define the suitability of a substrate. No further discussion is provided about the metrology system since it is well-known to those skilled in the arts.

Once a processed substrate is considered as acceptable, the signal data of the processed substrate may be included in the recalculation of a baseline. In an embodiment, a baseline may be established by analyzing each processed substrate. In an embodiment of the invention, an initial baseline may be established for a clean plasma processing chamber based on recommended manufactured baseline. Further, the soft and hard tolerance levels may be set at a high percentage to account for the initial baseline setting.

In an example, after substrate 01 has been processed, signal data (e.g., bias voltage, substrate temperature, etc.) of substrate 01 may be measured against like data associated with the recommended manufactured baseline to determine whether substrate 01 may be considered of acceptable quality standard. If substrate 01 pass the predefined guideline, the substrate may be considered as acceptable and the signal data for substrate 01 may be dynamically included in recalculating the baseline. In an embodiment, the recommended manufactured baseline may be given a certain percentage weight in the recalculation of the baseline. Note that this percentage weight may diminish as additional real signal data from processed substrates are collected.

The process of establishing a baseline may continue as more substrates are processed. In an embodiment of the invention, the baselines may be progressively refined as each substrate is measured and signal data is dynamically employed in the recalculation of the baselines. For each substrate that passes and whose signal data is within the confidence level range, the signal data may be included in recalculating the baseline, in an embodiment. As discussed herein, confidence level refers to a measurement distance from the baseline which is typically within the soft tolerance level. Similar to the soft and hard tolerance levels, the confidence levels may be set at a larger range, in the beginning. As substrates that fall between the top and bottom confidence levels are identified, a more accurate baseline, which accounts for the changing processing environment, may be generated.

Note that when a baseline is recalculated, the confidence levels may also be recalculated since the confidence levels are usually established as a percentage from the baseline. By also recalculating the confidence levels as the baseline shifts, a more accurate identification of acceptable substrates may be achieved. In an embodiment, the confidence levels may be asymmetrical since baseline tends to drift upward (e.g., top confidence level may be baseline+3 percent and bottom confidence level may be baseline−1 percent). However, confidence levels may also be symmetrical (e.g., top confidence level may be baseline+3 percent and bottom confidence level may be baseline−3 percent). In an embodiment, the confidence levels may either be asymmetrical or symmetrical, depending upon the statistical values calculated from the signal data collected.

In an embodiment, the soft and hard tolerance levels may also be recalculated based on the signal data collected. In another embodiment, for each substrate that fails, a hard tolerance level may be re-established if the signal data is less than the current hard tolerance level. In an example, if the substrate 01 does not pass, the signal data may be employed to establish a new hard tolerance level. In an example, if poor quality substrate 01 has a signal data of 5.7 volts, which is less than the current hard tolerance level, then the hard tolerance level may be reset at 5.7 volts.

The hard tolerance levels may also be adjusted if the signal data of substrates which are acceptable falls within a certain percentage of the baseline, in an embodiment. In an example, the hard tolerance level may be reset to the highest value of the signal data for the acceptable substrates. In another example, the hard tolerance level may be statistically recalculated (e.g., average, mean, standard deviation, etc.) to determine the new hard tolerance level.

In an embodiment, a change in the hard tolerance levels may also result in a change in the soft tolerance levels. In an example, if the soft tolerance level is hard tolerance level minus 5 percent, then as the hard tolerance level changes, the soft tolerance level may also change. As more substrates are being processed, the baseline, confidence levels, soft tolerance levels, and hard tolerance levels may be refined to account for the changes in the processing environment.

In an embodiment, the baseline may be recalculated based on a sliding window. In an example, the calculation for the baseline may require that only the most recent 5 acceptable substrates whose signal data falls within the confidence level range may be included in recalculating the baseline. In an example, signal data from substrate 01 through substrate 05 all fall within the confidence level range. The signal data for substrate 01 through substrate 05 may be employed in recalculating the baselines. Next, if the substrate 06 is also an acceptable substrate and falls within the confidence level, then substrate 06 may be included in the baseline recalculations. Since only the signal data from the most recent 5 acceptable substrates are included in the calculation, only data from substrate 02 through substrate 06 may now be used to recalculate the baseline. By using a sliding window, relevant data to the condition of the current state of the plasma processing chamber and/or hardware may be accounted for in determining the baseline.

In other embodiments of the invention, the baseline may be established based on a substrate batch process. In an example, a batch of substrates may include 10 substrates. When the first batch is processed, the substrates may go through a metrology system to determine which substrates are of acceptable quality. The signal data for the substrates are plotted. A statistical method, such as an average, may be employed to calculate the baseline for the batch of substrates by employing the signal data of the substrates that fall within the confidence level range. Based on the baseline, new confidence level range may be established for the next set of substrate batch. Again, the hard tolerance levels and soft tolerance levels may also shift as the signal data for the processed substrates are analyzed and new baseline and confidence levels are generated.

Figure 2A:
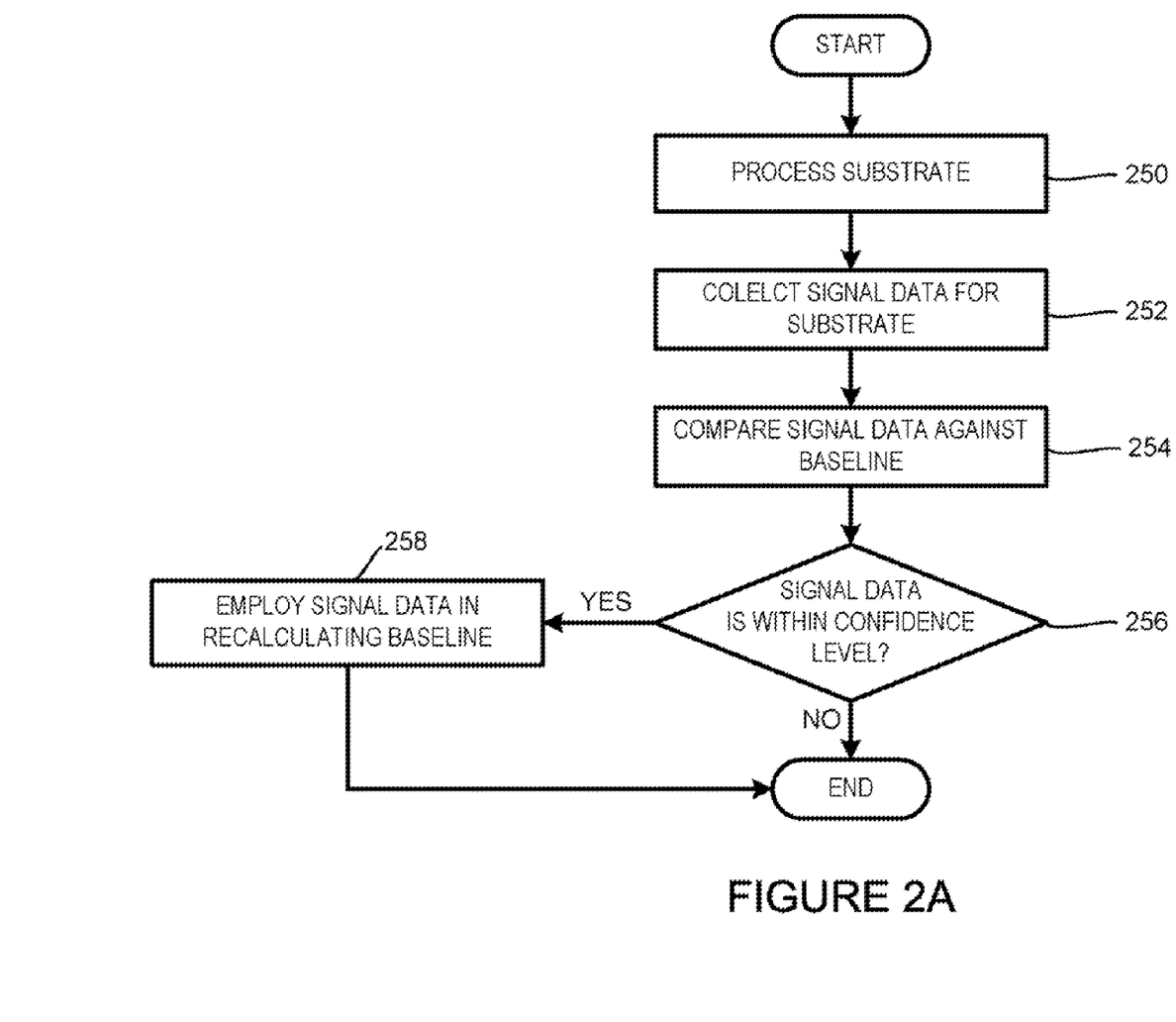
FIG. 2A shows, in an embodiment, a flow chart illustrating a method for determining a baseline based on a substrate-to-substrate basis.

The invention may be better understood with reference to the figures and discussions that follow. FIG. 2A shows, in an embodiment, a flow chart illustrating a method for determining a baseline based on a substrate-to-substrate basis. In other words, signal data of substrates which are considered as acceptable may be included in the recalculation of the baseline. At a first step 250, a substrate is processed. At a next step 252, signal data is collected from the processed substrate. At a next step 256, the signal data is compared against the current baseline. At a next step 258, if the signal data is within a confidence level range, the signal data may be employed in recalculating the baseline. If at next step 258, the signal data is not within a confidence level range, then the signal data may not be employed in recalculating the baseline.

Figure 2B:
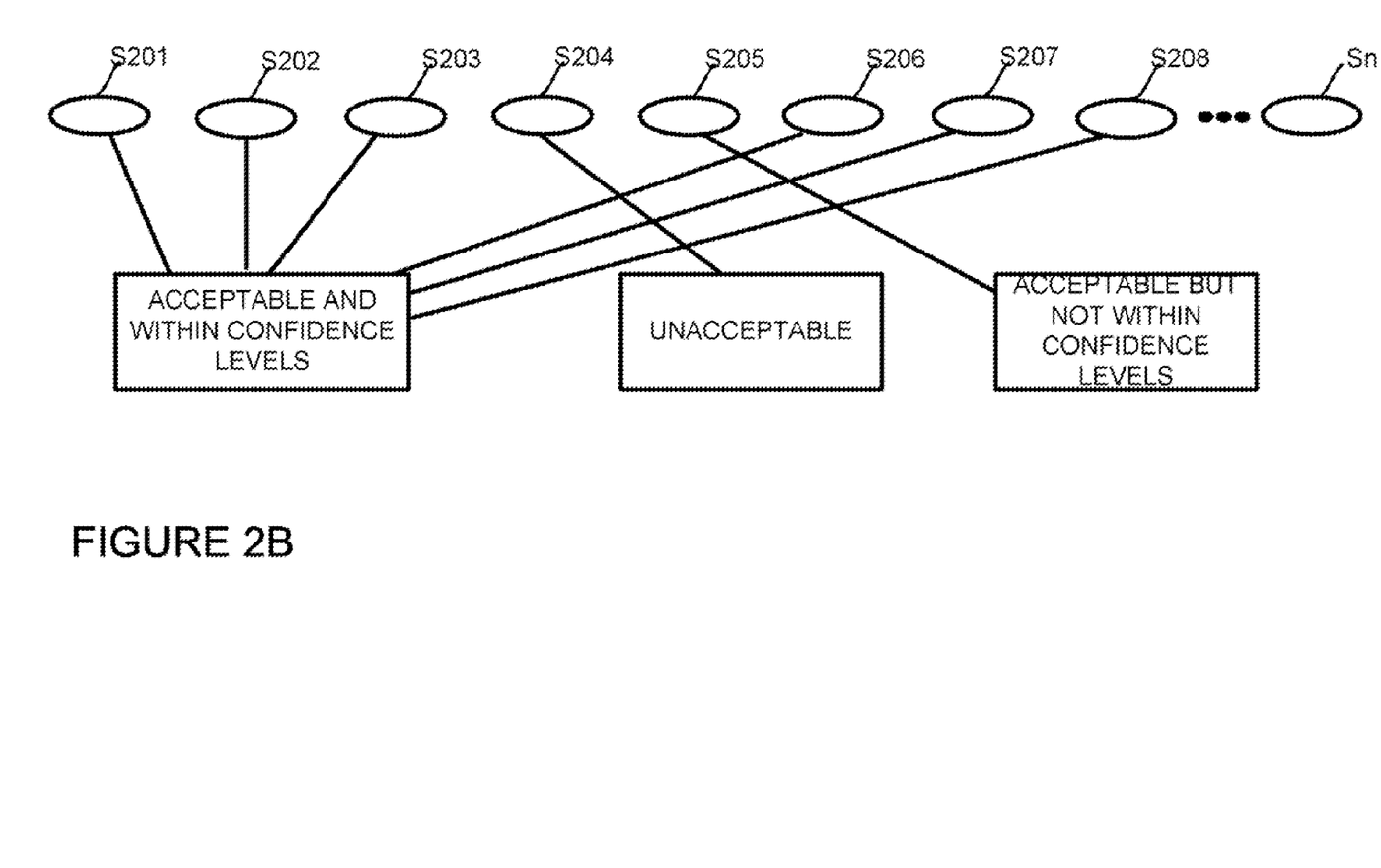
FIG. 2B shows, in an embodiment, a block diagram of the method described in FIG. 2A.

FIG. 2B shows, in an embodiment, a block diagram illustrating the method described in the flow chart of FIG. 2A. In an example, a plurality of substrates (S201, S202, S203, S204, S205, S206, S207, S208, and Sn) are being processed. As each substrate is being processed, a plethora of signal data is being collected.

After each substrate has been processed, the substrate may be measured through a metrology system. If the substrate is considered as acceptable, then the signal data for the substrate collected during processing may be compared against a baseline. Further, a top and bottom confidence levels may be established. The confidence levels may initially be large. In an embodiment, the confidence levels may be asymmetrical since the baseline tends to drift upward. In other words, the top confidence level may be set at a further proximity to the baseline than the bottom confidence level. In an example, the top confidence level may be 3 percent from the baseline whereas the bottom confidence level may be only 1 percent from the baseline. In another embodiment, the confidence levels may be symmetrical. In an example, both the top and bottom confidence levels may be 2 percent from the baseline.

In an example, the substrate has for S201 is 2.04 volts. Consider the situation wherein, for example, the baseline is set at 2.00 volts with the top confidence level being 3 percent above the baseline (i.e., 2.06 volts) and the bottom confidence level being 2 percent below the baseline (i.e., 1.96 volts). In this example, the signal data for S201 is within the confidence level. In an embodiment, the signal data of S201 may be automatically included in the recalculation of the baseline for substrate bias. In an embodiment, for a clean plasma processing chamber, a recommended manufactured baseline may be given a certain percentage weight in the recalculation of the baseline until enough signal data is collected.

For each substrate that is acceptable and whose signal data is within the confidence levels, the signal data may be automatically included in recalculating the baseline. In an example, five signal data (e.g., 1.98 volts, 1.99 volts, 2.00 volts, 2.01 volts, and 2.01 volts) have been gathered to establish the 2.00 volts baseline. Since the new signal data of 2.04 volts is within the confidence levels (e.g., 1.96 volts to 2.06 volts), the new signal data may be included in the recalculation of the baseline. By including the signal data of substrates that fall within the confidence levels, the baseline may be more accurate since the baseline is being adjusted for changes in the processing environment.

In an embodiment, the recalculation of the baseline may be based on a sliding window. Consider the situation wherein, for example, the baseline may be the average of the last five substrates whose signal data falls within the confidence levels. In an example, S201-S203, and S206-S207 are considered acceptable and have signal data which is within the confidence levels. However, S204 is not considered acceptable and S205 is considered acceptable but the signal data is not within the confidence level range. In recalculating the baseline, the signal data of the last five substrates whose signal data fall within the confidence level range (i.e., S201-S203, and S206-S207) are automatically averaged together. If S208 is also acceptable and its signal data fall within the confidence level range, then the baseline is now automatically recalculated based on the signal data from S202-S203, and S206-S208.

In an example, the baseline is currently 2.00 volts, the confidence level range is between 1.96 to 2.06 volts, the soft tolerance level range is between 1.96 volts and 2.10 volts, and the hard tolerance level range is between 1.80 and 2.20 volts. To calculate the current baseline of 2.00 volts, the signal data from S201-S208 are analyzed. The signal data is as followed: S201 is 1.98 volts, S202 is 1.99 volts, S203 is 2.00 volts, S204 is 2.3 volts. S205 is 2.08 volts, S206 is 2.01 volts, and S207 is 2.01 volts. Since only S201-S203 and S206-S207 are acceptable and also fall within the confidence level range, the signal data for the acceptable substrates may be employed in calculating the baseline. When the next substrate, S208, is measured and is considered as acceptable and within the confidence level range, the signal data from S208 may also be employed in recalculating the baseline. Since the baseline is calculated based on a sliding window average of the most recent five acceptable substrates that fall within the confidence level range, the signal data from S201 may no longer be employed in recalculating the baseline and only S202-S203 and S206-S208 may be employed in recalculating the baseline. Thus, the baseline may be recalculated and may shift from 2.00 volts to 2.01 volts (assuming an averaging approach is employed since other statistical approach are also possible). Since the baseline tends to shift over times as the condition of the plasma processing chamber and/or the hardware change, the sliding window method allows for hardware limitations to be automatically included in the recalculation of the baseline.

Figure 3A:
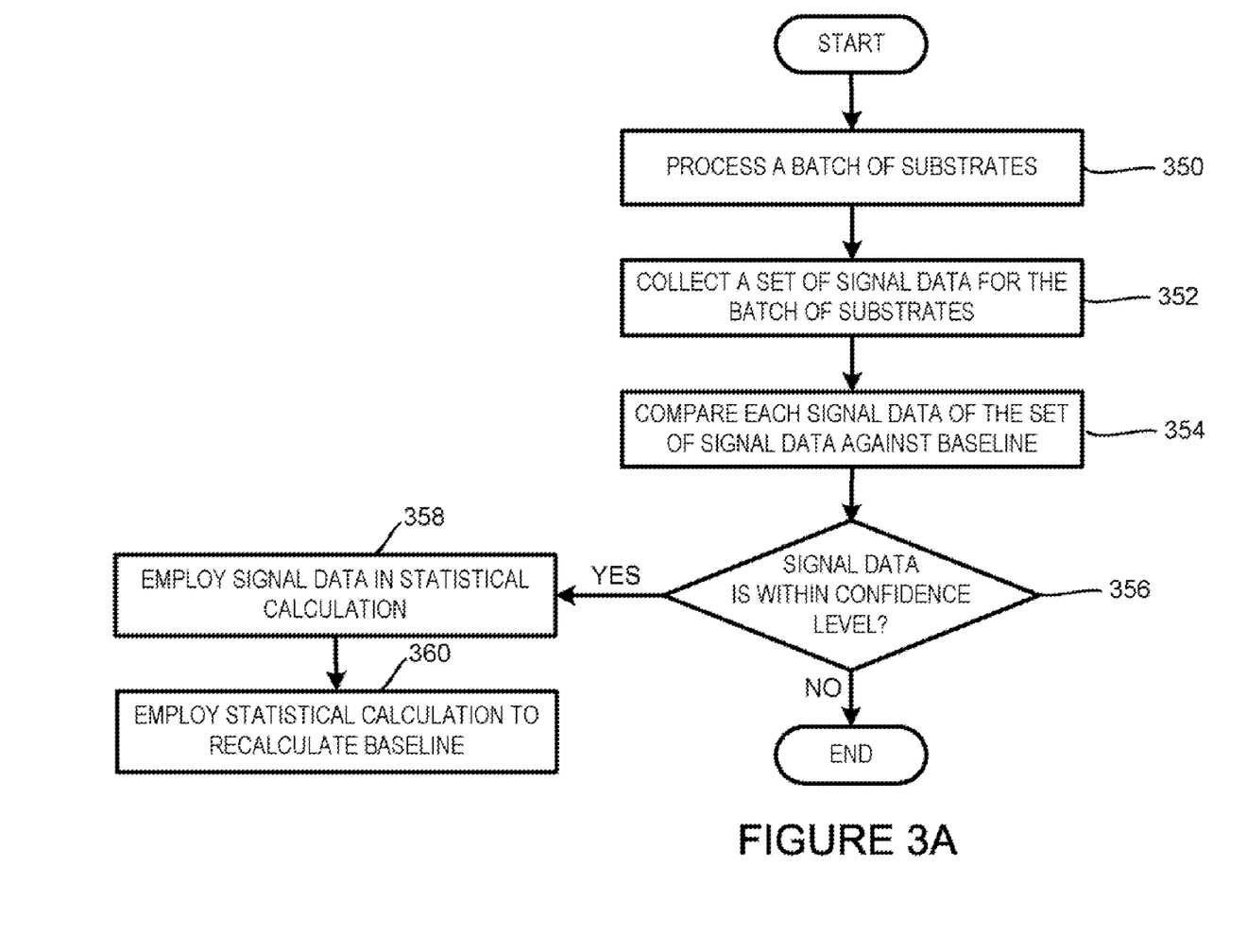
FIG. 3A shows, in an embodiment, a flow chart illustrating a method for determining a baseline based on a batch of substrates basis.

FIG. 3A shows, in an embodiment, a flow chart illustrating a method for determining a baseline based on a batch of substrates basis. In other words, a baseline is based on a plurality of batches of substrates. The process of establishing a baseline may include analyzing a plurality of batches of substrates. At a first step 350, a batch of substrates is processed. At a next step 352, a set of signal data is collected from the processed batch of substrates. At a next step 356, each signal data from the set of signal data is compared against the current baseline. At a next step 358, if the signal data is within a confidence level range, the signal data may be employed in performing a statistical calculation. Once all the signal data of the set of signal data has been analyzed and the statistical calculation has been performed, at a next step 360, the statistical calculation may be employ in recalculating the baseline. If at next step 360, the signal data is not within a confidence level range, then the signal data may not be employed in recalculating the baseline.

Figure 3B:
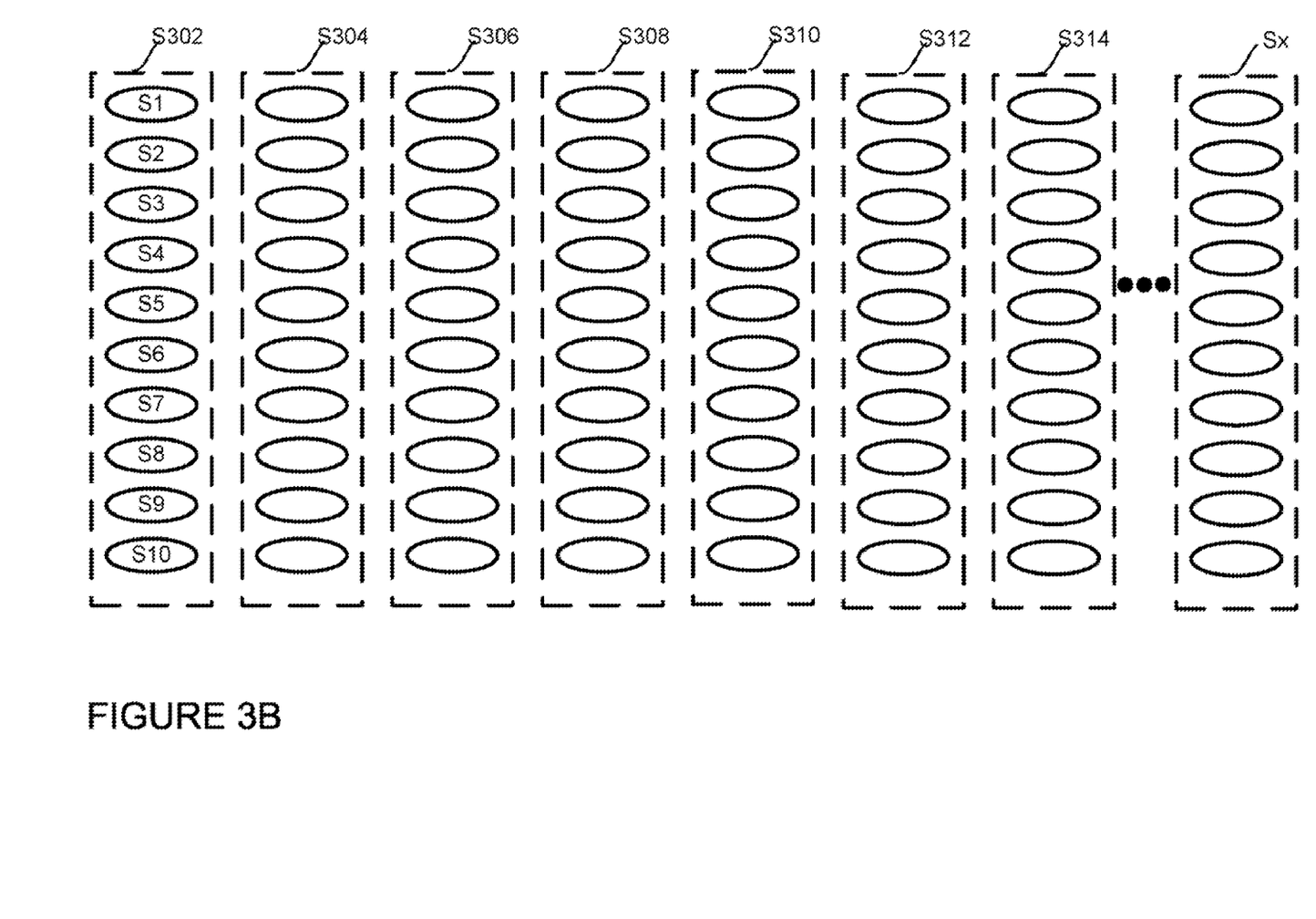
FIG. 3B shows, in an embodiment, a block diagram of the method described in FIG. 3A.
Figure 4:
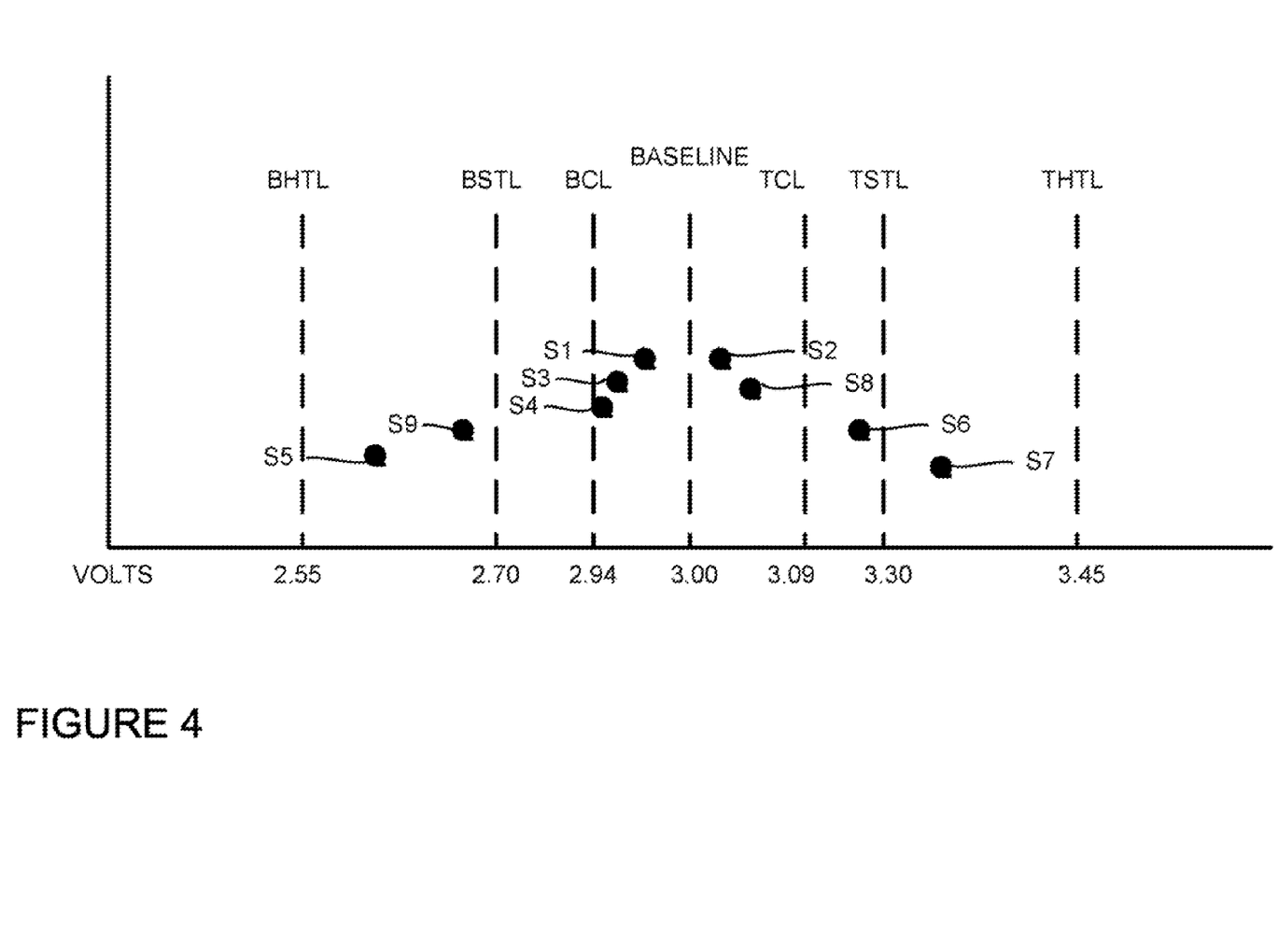
FIG. 4 shows, in an embodiment, signal data for batch of substrates which may be included in recalculating a baseline.

FIG. 3B shows, in an embodiment, a block diagram illustrating the method described in the flow chart of FIG. 3A. Consider the situation wherein, for example, a plurality of batches of substrates (S302, S304, S306, S308, S310, S312, S314, and Sx) is being processed. In this example, a batch of substrates may each include ten substrates. After the first batch of substrate 302 has been processed, each of the substrate within the batch may be measured. Substrates that are considered acceptable are analyzed. For the substrates within the batch whose signal data fall within the confidence levels, the signal data for these substrates may be included in recalculating the baseline, as shown in FIG. 4. In an example, although S1-S9 are acceptable, only S1-S4 and S8 also fall within the confidence level. The signal data for these substrates may be averaged, for example, to determine the new baseline.

Figure 5:
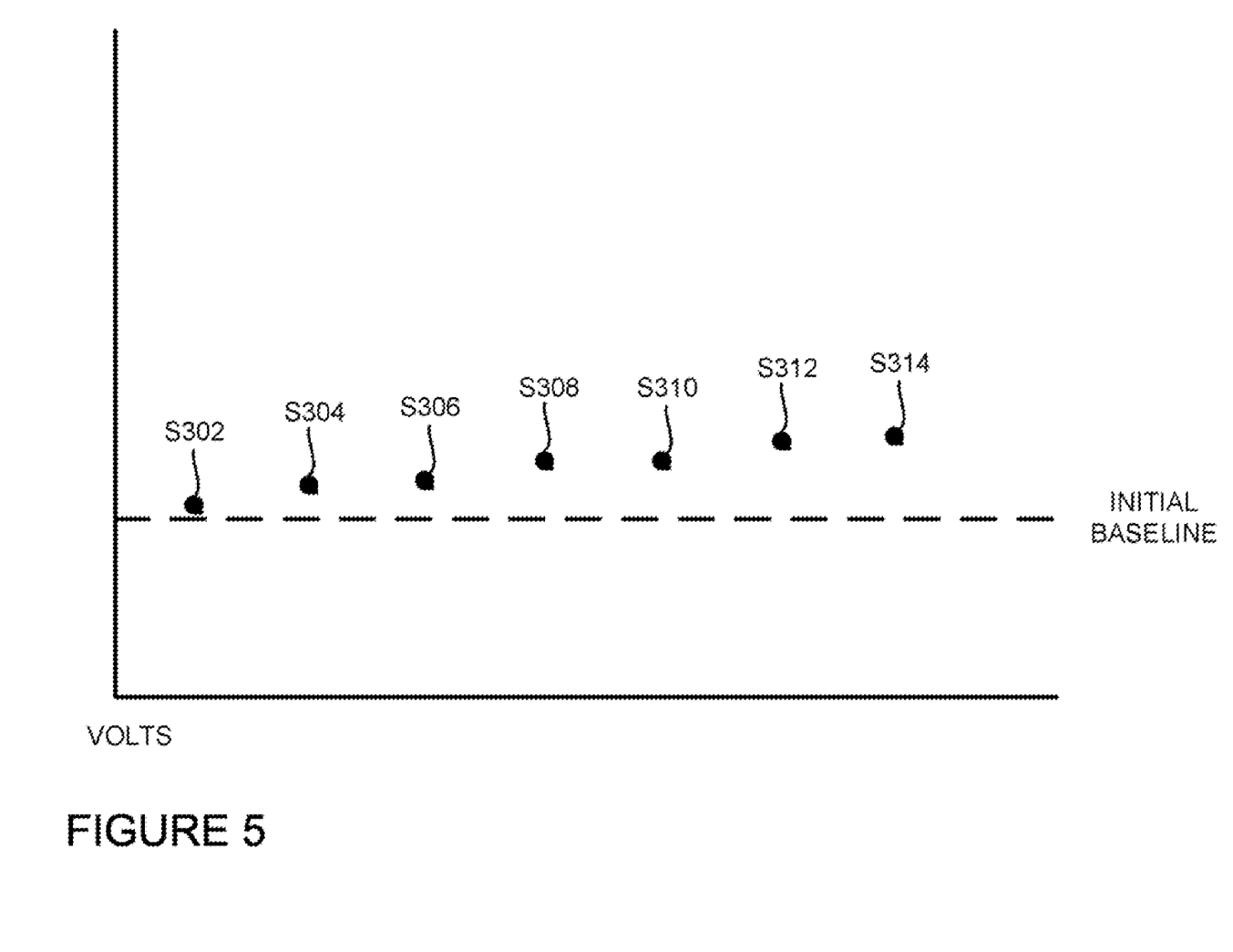
FIG. 5 shows, in an embodiment, a simple graph of a recalculated baseline based on data collected.

After batch of substrates S302 has been processed, measured, and analyzed, the next batch of substrates S304 may be processed, measured, and analyzed. Again, the substrates that are acceptable and whose signal data falls within the confidence levels may be included in recalculating the baseline. In an embodiment, the new baseline may be included as the next point in the final baseline, as shown in FIG. 5. In another embodiment, the calculated baselines for each of the batches of substrates may be averaged, for example, to recalculate the new baseline.

In another embodiment, a sliding window method may be employed to account for the hardware limitations. In an example, the average of the last five batches of substrates may be included in recalculating the baseline. Again, the number of batches of substrates that may be included may be defined based on past trends, client's needs, or other criteria. The sliding window method may enable conditions of the plasma processing chamber and/or hardware to be accounted for in the recalculation of the baseline.

In an embodiment, the values for the confidence levels, the soft tolerance levels, and the hard tolerance levels may also shift. As aforementioned, the initial values may be set at a high number. However, as more substrates are being processed and more signal data are being collected, the confidence levels, the soft tolerance levels, and the hard tolerance levels may be statistically refined based on the signal data of the substrates.

Figure 6:
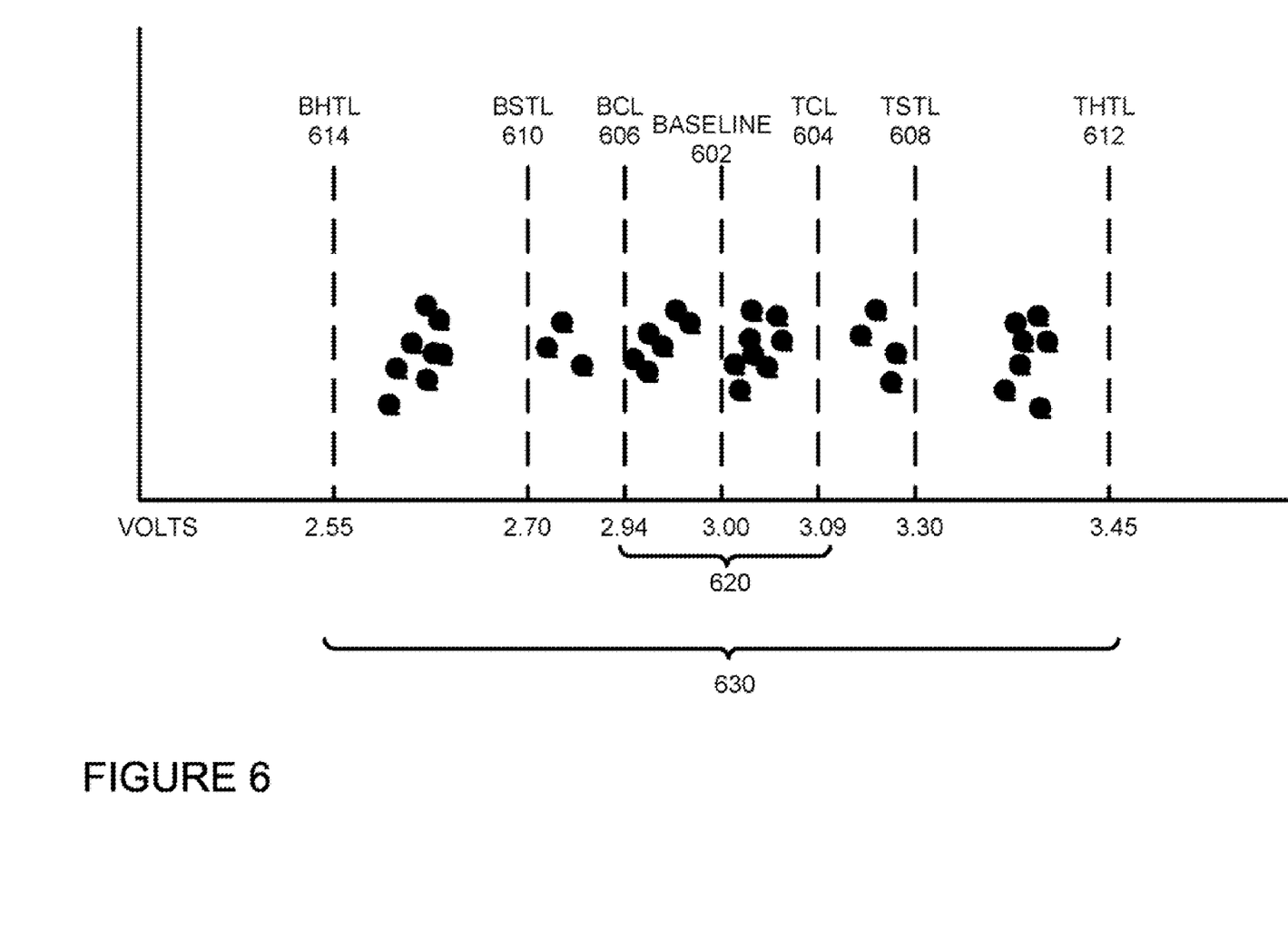
FIG. 6 shows, in an embodiment, a simple graph of signal data collected for substrates that are acceptable.

FIG. 6 shows, in an embodiment, a simple graph of signal data collected for substrates that are acceptable. Consider the situation wherein, for example, a baseline 602 is set at 3 volts, a top confidence level 604 is set at +3 percent (i.e., 3.09 volts), a bottom confidence level 606 is set at −2 percent (i.e., 2.94 volts), a top soft tolerance level 608 is set at +10 percent (i.e., 3.30 volts), a bottom soft tolerance level 610 is set at −10 percent (i.e., 2.70 volts), the top hard tolerance level 612 is set at +15 percent (i.e., 3.45 volts), and the bottom hard tolerance level 614 is set at −15 percent (i.e., 2.55 volts).

In an embodiment, the confidence levels may be recalculated based on the baseline. In an example, if the baseline moves from 3 volts to 3.5 volts, then the confidence level may be recalculated. The new top confidence level may be 3.5 volts plus 3 percent and the bottom confidence level may be 3.5 volts minus 2 percent.

In an embodiment, the values used to calculate the confidence levels may be statistically determined (e.g., standard deviation) based on the signal data collected. Section 620 shows the area between the top and bottom confidence levels. In an example, once the new baseline has been calculated, the standard deviation from the new baseline may be calculated for each of the signal data within Section 620. Two averages may be calculated based on the standard deviations above and below then new baseline to establish the new top and bottom confidence levels. Note, that this is just a simple example of how the confidence levels may be recalculated. Other more sophisticated methods may be employed to derive the new confidence levels.

Hard tolerance levels may also be refined. In an embodiment, a hard tolerance level may be reset if the signal data of a substrate that is not acceptable falls within the hard tolerance level range. In an example, if a processed substrate is not considered acceptable and its signal data of 3.4 volts is within the high tolerance level, then the top hard tolerance level may be reset to 3.4 volts.

In another embodiment, the hard tolerance levels may be reset if a cluster of signal data for acceptable substrates falls within a certain percentage of the baseline. As shown on the graph, most of the signal data are clustered within section 630, which is within the hard tolerance level range (612 and 614). In an embodiment, the hard tolerance level may be reset to the highest value of the signal data for the acceptable substrates. In another embodiment, the hard tolerance level may be statistically recalculated (e.g., average, mean, standard deviation, etc.) to determine the new hard tolerance level.

Once the hard tolerance level has been recalculated, the soft tolerance levels may be recalculated. In an embodiment, the soft tolerance level may be a percentage difference from the hard tolerance level (e.g., hard tolerance level +/−5 percent). In another embodiment, the soft tolerance level may be statistically determined based on the signal data collected. In an example, the soft tolerance level may be a certain standard deviation from the hard tolerance level.

FIGS. 2A, 2B, 3A, 3B, 4-6 are simple examples of how the baselines, confidence levels, the soft tolerance levels, and the hard tolerance levels may be dynamically calculated, although more sophisticated statistical and scientific methods may be employed. A large number of substrates are not being unnecessarily sacrificed to determine a pre-set baseline. Instead, by dynamically adjusting the baseline as substrates are being processed, fault detection is being based on baselines, confidence levels, soft tolerance levels, and hard tolerance levels that are accurately reflecting the changing conditions of the chamber and the hardware.

As can be appreciated from the foregoing, embodiments of the invention enable baselines to be dynamically established and adjusted allowing for the integration of hardware limitation into the calculation of the baseline. By removing the necessity for human intervention in the calculations of the baselines, baseline calculations may be easily performed across platforms without being limited to the individual skillset and/or knowledge. Further, the removal of human intervention also substantially reduces the possibility of human errors that may have contributed to inaccurate baselines. As such, the embodiments of the invention provide for more accurate baselines, thereby reducing the possibility of waste and defective devices.

While this invention has been described in terms of several embodiments, there are alterations, permutations, and equivalents, which fall within the scope of this invention. Also, the title, summary, and abstract are provided herein for convenience and should not be used to construe the scope of the claims herein. Further, in this application, a set of "n" refers to one or more "n" in the set. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing system, a method for adjusting a baseline, said method comprising:
   processing a first substrate;
   collecting a first signal data for said first substrate, said first signal data collected during or after said processing;
   comparing said first signal data against said baseline, said baseline used for determining acceptability of quality of processed substrates; and
   recalculating said baseline using said first signal data if said first signal data is within a confidence level range, said confidence level range is in between a top level above said baseline and a bottom level below said baseline, said confidence level being within a first tolerance range, wherein a processed substrate associated with measured signal data within said first tolerance range is deemed acceptable.

2. The method of claim 1 wherein said confidence level range is asymmetrical with said top confidence level being at a further distance away from said baseline than said bottom confidence level.

3. The method of claim 1 further comprising:
   processing a second substrate;
   collecting a second signal data for said second substrate;
   comparing said second signal data against said baseline; and
   including said second signal data in said recalculation of said baseline if said second signal data is within said confidence level range.

4. The method of claim 3 wherein said recalculation of said baseline is based on statistical calculations.

5. The method of claim 4 wherein said recalculation of said baseline is based on a sliding window method, said sliding window method including performing said statistical calculations on a group of signal data belonging to a set of substrates, said set of substrates changing as substrates are being processed.

6. The method of claim 1 further comprising recalculating said confidence level range using said first signal data.

7. The method of claim 1 further comprising recalculating said first tolerance range using said first statistical calculation.

8. The method of claim 1 further comprising re-establishing a tolerance level boundary of said first tolerance range to be said first signal data if said first signal data is outside said first tolerance range.

9. The method of claim 8 further comprising changing a second tolerance range according to said re-establishing said tolerance level boundary of said first tolerance range, said confidence level range being within said second tolerance range, said second tolerance range being within first tolerance range.

10. The method of claim 1 further comprising issuing an alarm if a signal data is outside a second tolerance range, said confidence level range being within said second tolerance range, said second tolerance range being within said first tolerance range.

11. In a plasma processing system, a method for adjusting a baseline, said method comprising:
    processing a first batch of substrates, said first batch of substrates including at least one substrate;
    collecting a first set of signal data for said first batch of substrates, said first set of signal data collected during or after said processing;
    comparing each signal data of said first set of signal data against said baseline, said baseline used for determining acceptability of quality of processed substrates;
    including said each signal data of said first set of signal data in a first statistical calculation if said each signal data is within a confidence level range, said confidence level range is in between a top level above said baseline and a bottom level below said baseline, said confidence level being within a first tolerance range, wherein a processed substrate associated with measured signal data within said first tolerance range is deemed acceptable; and
    recalculating said baseline using said first statistical calculation.

12. The method of claim 11 wherein said confidence level range is asymmetrical with said top confidence level being at a further distance away from said baseline than said bottom confidence level.

13. The method of claim 11 further comprising:
    processing a second batch of substrates, said second batch of substrates including at least one substrate;
    collecting a second set of signal data for said second batch of substrates;
    comparing each signal data of said second set of signal data against said baseline;
    including said each signal data of said second set of signal data in a second statistical calculation if said signal data is within said confidence level range; and
    recalculating said baseline based on said second statistical calculation.

14. The method of claim 13 wherein said baseline is recalculated using a statistical approach.

15. The method of claim 14 wherein said baseline is recalculated based on a sliding window method, said sliding window method including performing said statistics on a group of signal data belonging to a set of substrates, said set of substrates changing as substrates are being processed.

16. The method of claim 11 further comprising recalculating said confidence level range using said first statistical calculation.

17. The method of claim 11 further comprising recalculating said first tolerance range using said first statistical calculation.

18. The method of claim 11 further comprising re-establishing a tolerance level boundary of said first tolerance range to be a signal data value associated with a substrate of said first batch of substrates if said signal data value is outside said first tolerance range.

19. The method of claim 18 further comprising changing a second tolerance range according to said re-establishing said tolerance level boundary of said first tolerance range, said confidence level range being within said second tolerance range, said second tolerance range being within first tolerance range.

20. The method of claim 11 further comprising issuing an alarm if a signal data value associated with a substrate of said first batch of substrates is outside a second tolerance range, said confidence level range being within said second tolerance range, said second tolerance range being within said first tolerance range.

* * * * *